(12) United States Patent
Wang

(10) Patent No.: US 7,518,455 B2
(45) Date of Patent: Apr. 14, 2009

(54) DELTA-SIGMA MODULATED FRACTIONAL-N PLL FREQUENCY SYNTHESIZER

(75) Inventor: Fucheng Wang, San Jose, CA (US)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 70 days.

(21) Appl. No.: 11/828,584

(22) Filed: Jul. 26, 2007

(65) Prior Publication Data

US 2008/0024240 A1    Jan. 31, 2008

Related U.S. Application Data

(60) Provisional application No. 60/820,607, filed on Jul. 28, 2006.

(51) Int. Cl.
*H03L 7/16* (2006.01)
*H03L 7/18* (2006.01)

(52) U.S. Cl. .......................................... 331/16; 331/25

(58) Field of Classification Search ................ 331/1 A, 331/16, 18, 25; 327/156–159; 332/127; 360/51; 375/376; 455/260
See application file for complete search history.

(56) References Cited

U.S. PATENT DOCUMENTS 7,071,787 B2 * 7/2006 Knierim et al. ............. 331/1 A

* cited by examiner

*Primary Examiner*—David Mis (57) ABSTRACT

A delta-sigma modulated fractional-N PLL frequency synthesizer is provided. The frequency synthesizer includes a phase frequency detector for receiving a reference signal with a reference frequency (Fref) and an overflow signal to output a phase difference signal by detecting a phase and frequency difference between the reference signal and the overflow signal; a charge pump for generating an output current pulse in response to the phase difference signal; a loop filter for filtering the charge pump output current pulse and generating a corresponding control voltage; a VCO for generating a VCO output signal with a voltage controlled frequency (Fvco) in response to the control voltage; and a delta-sigma modulator, with a clock input terminal for receiving the VCO output signal, an overflow output terminal for generating the overflow signal and an integer input terminal, for determining the ratio of the VCO frequency (Fvco) and the reference frequency (Fref).

19 Claims, 7 Drawing Sheets

DELTA-SIGMA MODULATED FRACTIONAL-N PLL FREQUENCY SYNTHESIZER

CROSS REFERENCE TO RELATED PATENT APPLICATION

This application is entitled to the benefit of Provisional Patent Application Ser. No. 60/820,607 filed Jul. 28, 2006.

FIELD OF THE INVENTION

The present invention relates to a phase locked loop (PLL) frequency synthesizer, and more particularly, to a delta-sigma modulated fractional-N phase locked loop frequency synthesizer.

BACKGROUND OF THE INVENTION

Due to the fast development of communication, such as handheld telephones, research and development personnel have always striven for a frequency synthesizer that provides high frequency resolution and fast frequency switching time. However, a frequency synthesizer with these qualities has been hard to achieve.

Figure 1:
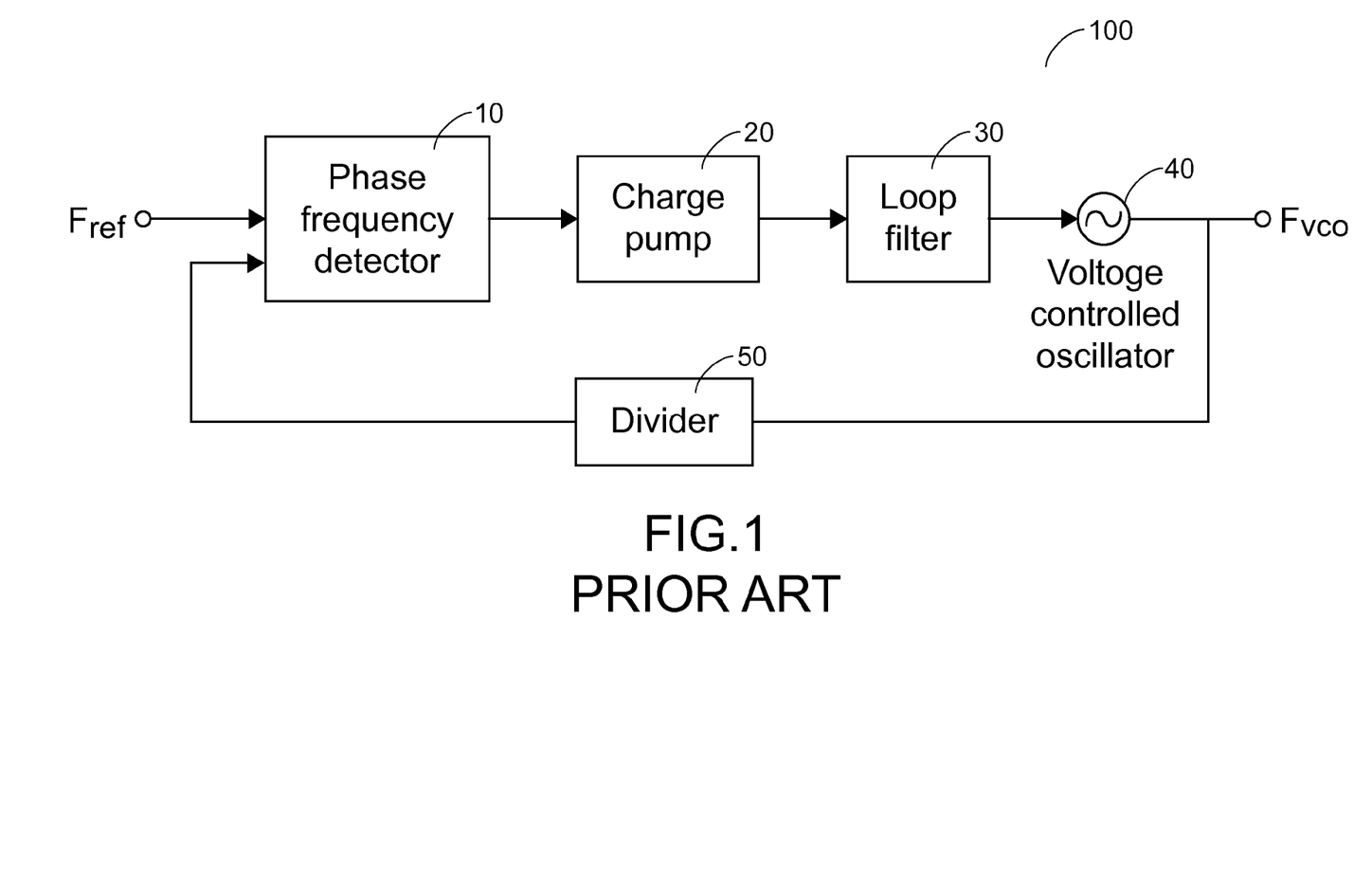
FIG. 1 depicts a conventional integer-N PLL frequency synthesizer.

Please refer to FIG. 1, which illustrates a conventional integer-N PLL frequency synthesizer. The PLL 100 includes a phase frequency detector 10, a charge pump 20, a loop filter 30, a VCO (voltage controlled oscillator) 40 and a divider 50. A reference signal with reference frequency (Fref) generated by a reference oscillator (not shown) and a frequency divided signal are simultaneously inputted to the phase frequency detector 10. The phase frequency detector 10 detects the phase and frequency difference between the reference signal and the frequency divided signal, and then outputs a phase difference signal to the charge pump 20. The charge pump 20 then, according to the duty cycle of the phase difference signal, generates a corresponding output current pulse into the loop filter 30. The loop filter 30 integrates and transforms the charge pump output current pulse into a control voltage to the VCO 40, where the VCO 40 adjusts its output frequency (Fvco) in accordance with the control voltage. The divider 50 receives the VCO output signal and the frequency Fvco is divided by an integer N to generate the frequency-divided signal, which is inputted to the phase frequency detector 10.

Since N is an integer, the VCO frequency (Fvco) must be an integer multiple of the reference frequency (Fref). Hence the frequency resolution of a typical integer-N PLL frequency synthesizer is relatively low.

In recent years, fractional-N frequency synthesizers have been broadly introduced. Because the average N is a fractional number, the VCO frequency (Fvco) is therefore a fractional multiple of the reference frequency (Fref). As a result, the frequency resolution can be sufficiently enhanced.

Figure 2:
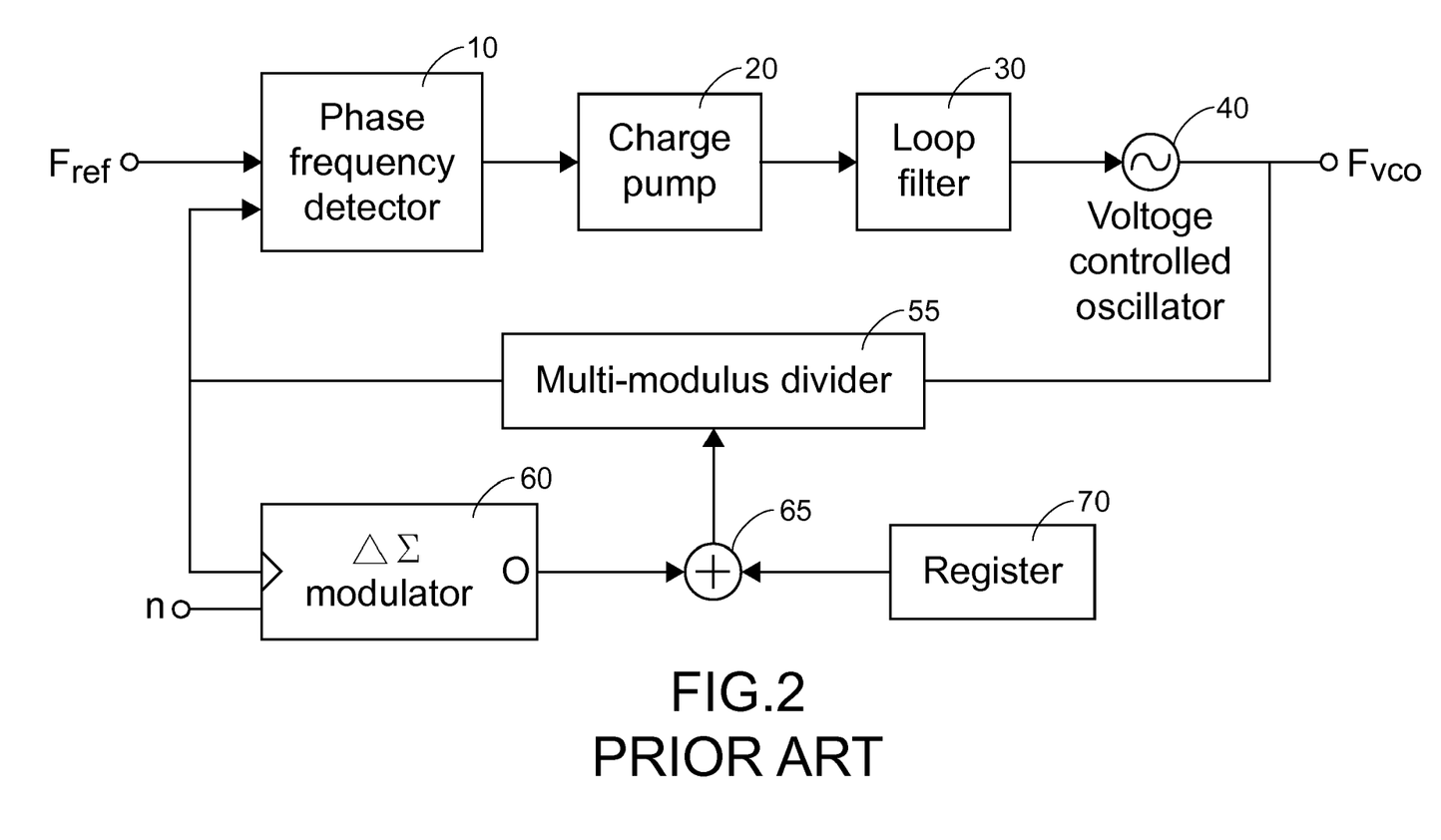
FIG. 2 depicts a conventional fractional-N PLL frequency synthesizer.

Please refer to FIG. 2, which illustrates a conventional fractional-N PLL frequency synthesizer. The time-varying integer N is controlled by the sum of a fixed integer (A) from a register 70 and a variable integer provided by the delta-sigma modulator (hereafter "$\Delta\Sigma$ modulator") 60. As can be seen from FIG. 2, the $\Delta\Sigma$ modulator 60 has a clock input terminal and a fractional value (n) input terminal. The clock input terminal of the $\Delta\Sigma$ modulator 60 connects to the output terminal of the multi-modulus divider 55, while the output terminal of the $\Delta\Sigma$ modulator 60 connects to an adder 65. Furthermore, the output of the register 70, which stores the fixed integer A is also connected to adder 65. The division ratio N of the feedback divider is synchronously varied with its own output and equals to the output value of the adder 65.

Figure 3A:
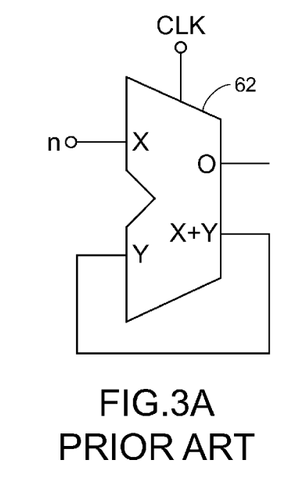
FIG. 3A depicts a first-order ΔΣ modulator realized by a digital accumulator.

]FIG. 3A illustrates a first-order $\Delta\Sigma$ modulator realized by a digital accumulator. For instance, the size of the digital accumulator 62, with a clock input terminal (CLK), a first input terminal (X), a second input terminal (Y), a summation output terminal (X+Y) and an overflow output terminal (O), is d bits. The first input terminal (X) receives a first value (n). The second input terminal (Y) connects to the summation output terminal (X+Y). The overflow output terminal (O) is the output terminal of the first-order $\Delta\Sigma$ modulator. For example, when n=5 and d=4, Table 1 lists the output values of the summation output terminal (X+Y) and the overflow output terminal (O) along with the increment of input clock cycles.

TABLE 1

| (X+Y) | | | | | | | | | | | | | | | | | |
|---|---|---|---|---|---|---|---|---|---|---|---|---|---|---|---|---|---|
| 5 | 10 | 15 | 4 | 9 | 14 | 3 | 8 | 13 | 2 | 7 | 12 | 1 | 5 | 11 | 0 | 5 | 10 | 15 | 4 |
| (O) | | | | | | | | | | | | | | | | | |
| 0 | 0 | 0 | 1 | 0 | 0 | 1 | 0 | 0 | 1 | 0 | 0 | 1 | 0 | 0 | 1 | 0 | 0 | 0 | 1 |

Figure 3B:
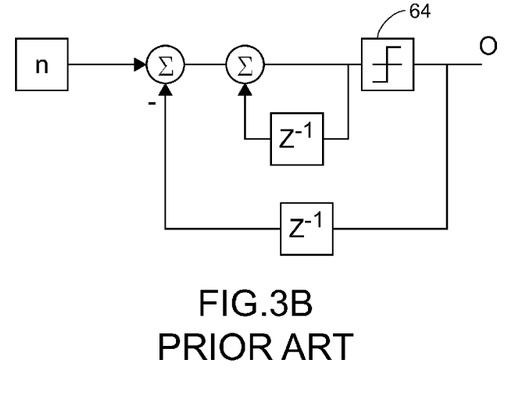
FIG. 3B depicts the discrete time function of the first-order ΔΣ modulator.

According to Table 1, the summation output terminal (X+Y) and the overflow output terminal (O) repeatedly generate the same output sequence in every 16 clock cycles, where the overflow output terminal (O) toggles 5 times. Similarly, when the first value (n) is 9, the overflow output terminal (O) would toggle 9 times in every 16 clocks. Therefore, the first value (n) represents the number of times the overflow output terminal (O) toggles in every 16 clocks. The repetitive period of 16 clocks is determined by the size of the digital accumulator, that is, d=4 and $2^d$ represents the 16 clocks. Therefore when the size of digital accumulator 62 is d bits, and the first value is n, the overflow output terminal (O) shall toggle n times in every $2^d$ clocks, and the summation output terminal (X+Y) would generate the same output sequence in every $2^d$ clocks. The first-order $\Delta\Sigma$ modulator can also be represented by the discrete time function, as illustrated by FIG. 3B. When the accumulating value exceeds a maximum value that corresponds to the size of the digital accumulator, the digital accumulator overflows and the comparator 64 produces a "1". When the accumulating value does not exceed the maximum value, the digital accumulator does not overflow and the comparator 64 produces a "0". In other words, the comparator 64 uses the maximum value of the digital accumulator as the threshold for comparison.

Referring to FIG. 2 again, because the clock of $\Delta\Sigma$ modulator 60 is decided by the output of the multi-modulus divider 55, using d=4, n=5 as example, in every 16 clocks, the overflow output terminal (O) of $\Delta\Sigma$ modulator 60 toggles 5 times. That is to say, in every 16 clocks, when the overflow output terminal (O) has not been toggled, the multi-modulus divider 55 divides the Fvco by A (N=A). On the other hand, when the overflow output terminal (O) is toggled, the multi-modulus divider 55 divides Fvco by A+1 (N=A+1). Therefore, the averaged Fvco is Fvco=(A+5/16)*Fref, which means that N is a non-integer, i.e. a fractional number "A+5/16." In general, when the size of the ΔΣ modulator is d, and input value is n, it results in an averaged division ratio, $N=A+n/2^d$. Therefore, the fractional-N phase locked loop frequency synthesizer is realized by the prior art.

The conventional fractional-N PLL frequency synthesizer illustrated in FIG. 2 requires a ΔΣ modulator 60 and a multi-modulus divider 55, which is often the most challenging part of the circuit design.

SUMMARY OF THE INVENTION

One object of the present invention is to disclose a simplified fractional-N PLL frequency synthesizer, so that the fractional frequency division ratio N of the frequency synthesizer can be determined by the size and the input integer of the ΔΣ modulator, e.g. a ΔΣ numeric counter.

The present invention discloses a fractional-N PLL frequency synthesizer, comprising: a phase frequency detector for receiving a reference signal with a reference frequency and an overflow signal, and then outputting a phases frequency difference signal by detecting a phase and frequency difference between the reference signal and the overflow signal; a charge pump for generating a charge pump output current pulse in response to the phase frequency difference signal; a loop filter for filtering the charge pump output current pulse to correspondingly generate a control voltage; a voltage controlled oscillator for generating a VCO output signal with a voltage controlled frequency in response to the control voltage; and a delta-sigma modulator having a clock input terminal for receiving the output signal, an overflow output terminal for generating the overflow signal and an integer input terminal for determining a ratio between the voltage controlled frequency and the reference frequency.

The present invention also discloses a fractional-N PLL frequency synthesizer, comprising: a phase frequency detector for receiving a reference signal with a reference frequency and an overflow signal, and then outputting a phases frequency difference signal by detecting a phase and frequency difference between the reference signal and the overflow signal; a charge pump for generating a charge pump output current pulse in response to the phase frequency difference signal; a loop filter for filtering the charge pump output current pulse to correspondingly generate a control voltage; a voltage controlled oscillator for generating a VCO output signal with a voltage controlled frequency in response to the control voltage; a pre-scaler for receiving the output signal and dividing the voltage controlled frequency by a first integer to output a frequency divided signal; and a delta-sigma modulator having a clock input terminal for receiving the frequency divided signal, an overflow output terminal for generating the overflow signal and a second integer input terminal for determining a ratio between the voltage controlled frequency and the reference frequency according to the first integer and the second integer.

The above contents of the present invention will become more readily apparent to those ordinarily skilled in the art after reviewing the following detailed description and accompanying drawings, in which:

DETAILED DESCRIPTION OF THE PREFERRED EMBODIMENT

In FIG. 2, taking d=4 and n=5 for the first-order ΔΣ modulator as example, the overflow output terminal (O) of ΔΣ modulator 60 shall toggle 5 times in every 16 clocks. In other words, the output frequency of the overflow output terminal is 5/16 times the input frequency of the clock input terminal (CLK). Thus, the first input value (n) determines a fractional ratio between the frequencies of the overflow output terminal (O) and the clock input terminal of ΔΣ modulator 60. After programming an integer 200 into the register 70, for example, the adder 65 then outputs 200 or 201 to the multi-modulus divider 55. As the long-term average, it generates a frequency being divided by "200+5/16." However, the multi-modulus divider 55 is rather challenging to be implemented.

Figure 4:
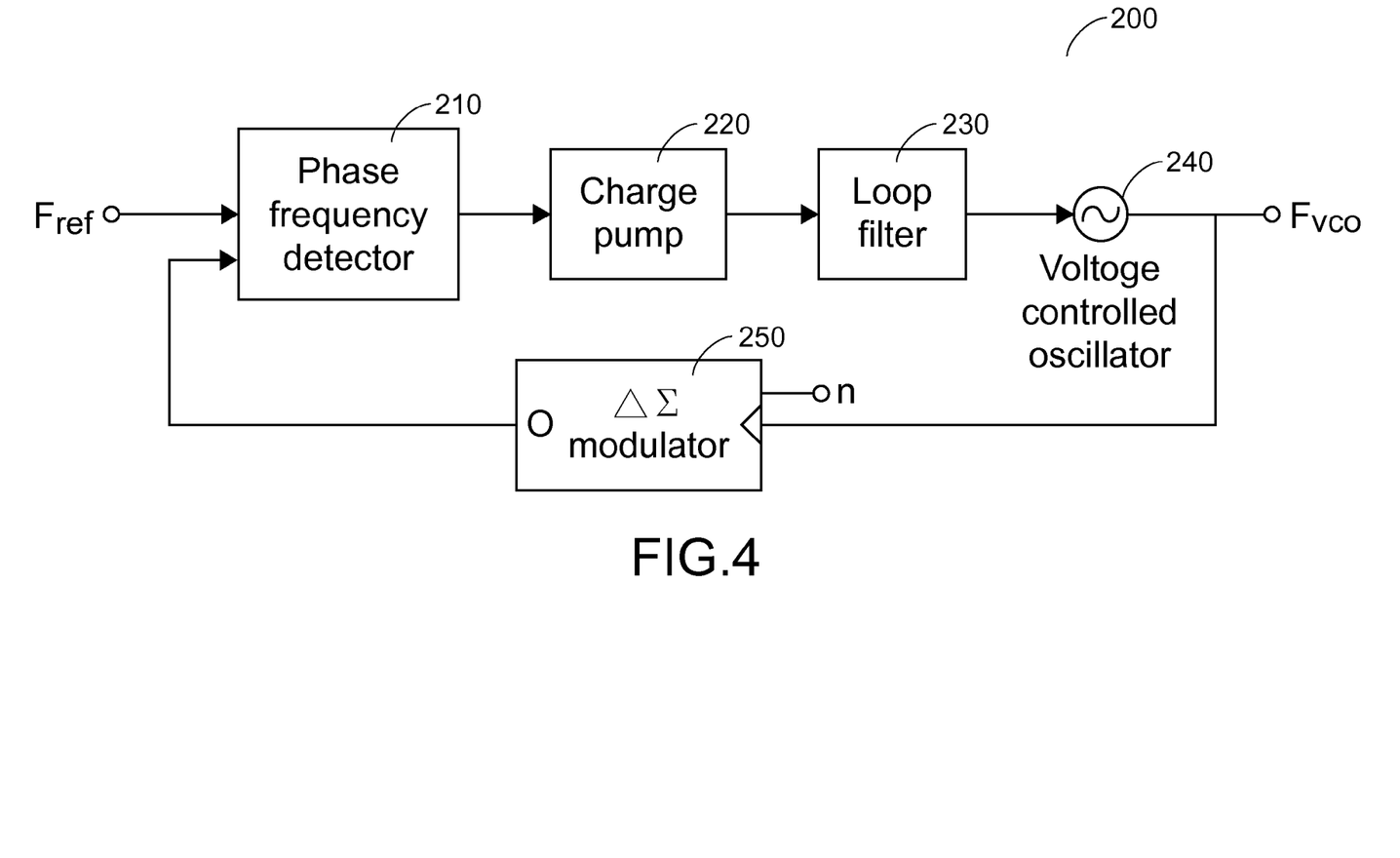
FIG. 4 depicts a fractional-N PLL frequency synthesizer according to one embodiment of the present invention.

Please refer to FIG. 4, which illustrates a fractional-N PLL frequency synthesizer 200, comprising a phase frequency detector 210, a charge pump 220, a loop filter 230, a VCO (voltage controlled oscillator) 240 and a ΔΣ modulator 250. A reference signal with a reference frequency (Fref) is generated by a reference oscillator (not shown), and the reference signal and an overflow signal from the ΔΣ modulator 250, e.g. a ΔΣ numeric counter, enter the phase frequency detector 210. The phase frequency detector 210 detects a phase and frequency difference between the reference signal and the overflow signal, and then outputs a phase difference signal to the charge pump 220. The charge pump 220 then generates a corresponding output current pulse to the loop filter 230 according to the duty cycle of the phase difference signal. For example, the width of the charge pump current pulse is proportional to the duty cycle of the phase difference signal. The loop filter 230 integrates and transforms the output current pulse of the charge pump 220 into a control voltage to the VCO 240, where the VCO 240 adjusts its output frequency (Fvco) in accordance with the control voltage. The clock input terminal of the ΔΣ modulator 250 receives the output signal of the VCO 240 and the overflow output terminal (O) of the ΔΣ modulator 250 outputs the overflow signal into the phase frequency detector 210.

Take d as the size of the ΔΣ modulator 250 and n as the first value in the above embodiment as an example. The output signal of the VCO 240 with the frequency Fvco enters the clock input terminal of the ΔΣ modulator 250, and for an average of every $2^d$ clocks, the overflow output terminal (O) generates n pulses. Thus, the ΔΣ modulator 250 generates the overflow signal with high-low levels according to the output signal of the VCO 240 feeding to the clock input terminal of the ΔΣ modulator 250. Therefore, the frequency of the overflow signal from overflow output terminal is $n/2^d$ times the output frequency (Fvco). Since the frequency of the overflow signal is equal to that of the reference frequency (Fref) when PLL 210 is locked, it leads to Fref=n/$2^d$*Fvco or Fvco=$2^d$/n*Fref. Taking d=4 and n=5 as an example, a fractional division ratio N=16/5=3+⅕ is deduced. According to the output signal of the VCO 240 entering the clock input terminal of the ΔΣ modulator 250, the division ratio between the overflow signal outputted by the ΔΣ modulator 250 and the output signal of the VCO 240 is represented by the fractional number N. The present invention discloses a simplified fractional-N PLL frequency synthesizer structure where a ΔΣ modulator 250, e.g. a ΔΣ numeric counter replaces a much more complicated circuit structure formed by the ΔΣ modulator and the multi-modulus divider in the conventional fractional-N frequency synthesizer.

Taking d=32 and n=235,260,482 as an example, N is $2^{32}$/235260482=18.25622. When the reference frequency (Fref) is 4.92 MHz, the VCO output frequency (Fvco) is 89.82 MHz.

For high frequency applications, in order to raise the VCO 240 output frequency (Fvco), a fixed-integer divider with a fixed-integer division ratio N' is preferably placed between the VCO 240 and the ΔΣ modulator 250. This fixed-integer frequency divider is called a pre-scaler. Taking d=32, n=235260482, and N'=33 as an example, the fractional division ratio N is ($2^{32}$/235260482)=18.25622. When the Fref is 4.92 MHz, and the division ratio of the pre-scaler is 33, the Fvco shall be (33)*($2^{32}$/235260482)*Fref=2.964 GHz when PLL is locked.

Figure 5A:
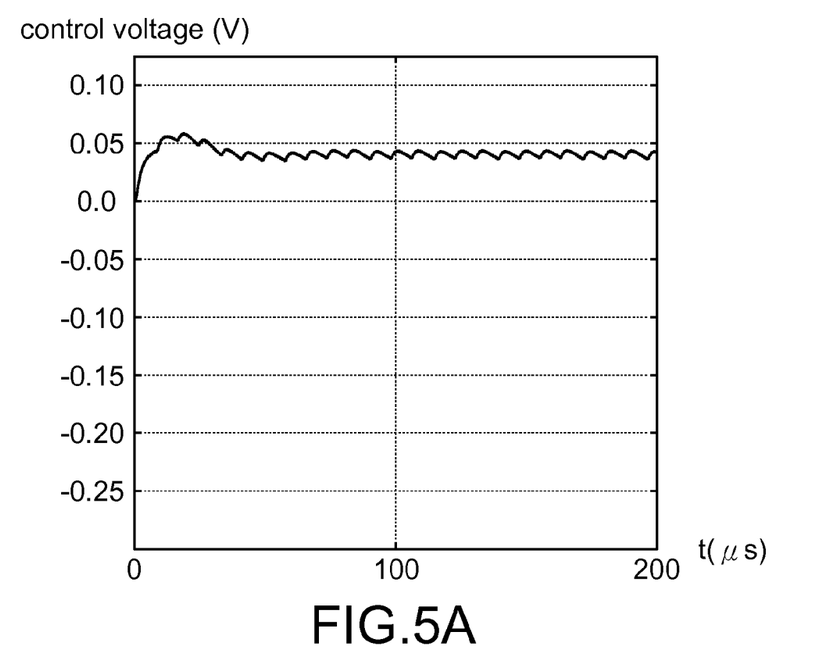
FIG. 5A depicts a simulated frequency locking transient characteristic of VCO control voltage generated by a first-order ΔΣ modulated fractional-N PLL frequency synthesizer.
Figure 5B:
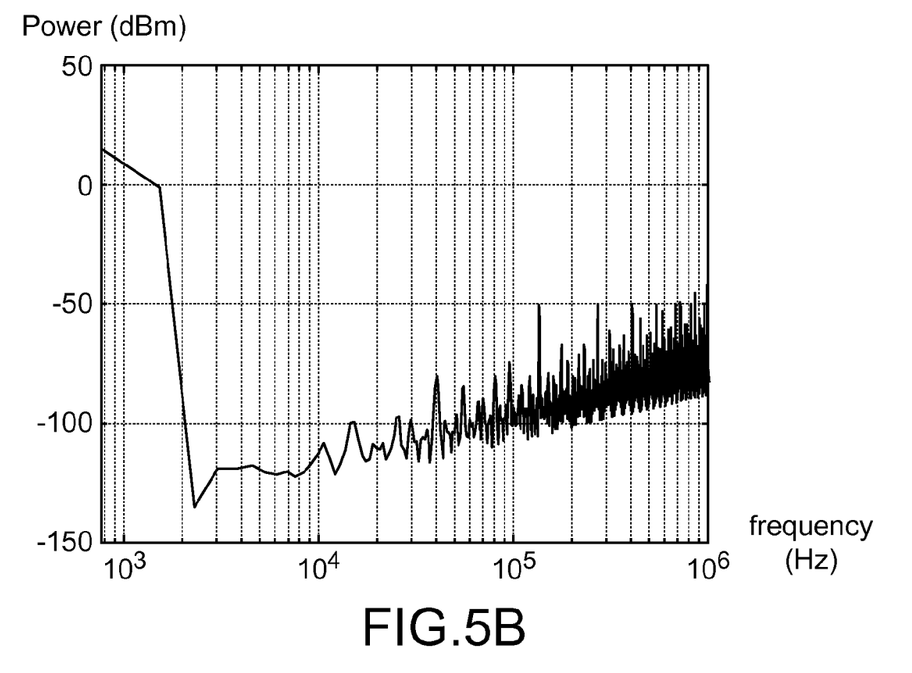
FIG. 5B depicts the Fast Fourier Transformation (FFT) spectrum of the first-order ΔΣ modulator output shown in FIG. 3B.

]Please refer to FIG. 5A, which illustrates the relationship between time and control voltage generated by the first-order ΔΣ modulated fractional-N PLL frequency synthesizer. Correspondingly, FIG. 5B illustrates the Fast Fourier Transformation (FFT) spectrum of the first-order ΔΣ modulated output signal. As shown in FIG. 5A, the control voltage appears as serious ripples near the steady state. This phenomenon can be explained by the output pattern of the first-order ΔΣ modulator listed in Table 1. Table 1 exemplifies the case with n=5 and d=4. It is observed that the modulator output bit toggles periodically in every 16 clocks. Such periodical output signal pattern not only relates to the control voltage ripples near the steady state in FIG. 5A, but also the spurs in the FFT spectrum in FIG. 5B.

Moreover, the present invention utilizes a second-order (or higher) ΔΣ modulator, to suppress spurs. Please refer to FIG. 6, which illustrates a discrete time model of an exemplified second-order ΔΣ modulator. This second-order ΔΣ modulator is realized by cascading a plurality of accumulators to form a single loop. The modulator contains four gain coefficients, a, b, c and e, which in general are set as 1. A quantization noise shaping of the second-order ΔΣ modulator can be adjusted by tuning the gain coefficients a, b, c and e without affecting the desired fractional relation. The gain coefficients a, b, c and e are preferably chosen as $2^n$ (where n is an integer), such as ½, ¼, ⅛ . . . etc. to minimize the circuit complexity, since in digital circuit implementation, the multiplication with $2^n$ can be realized by simple bit shifting. The second-order ΔΣ modulator output can be chosen at either the $1^{st}$ comparator 252 output (O1) at the last stage, or alternatively at the $2^{nd}$ comparator 254 (dummy comparator) output (O2). In this ΔΣ modulator, the $1^{st}$ comparator 252 positions on the feedback path, whose comparing threshold is the maximum value of the second-order ΔΣ modulator. On the other hand, the $2^{nd}$ comparator 254 positions at an independent output path with its comparing threshold capable of being programmed arbitrarily, in order to vary the duty cycle of the overflow signal. Preferably, the comparing threshold of the $2^{nd}$ comparator is half of the maximum value of the second-order ΔΣ modulator.

Figure 6:
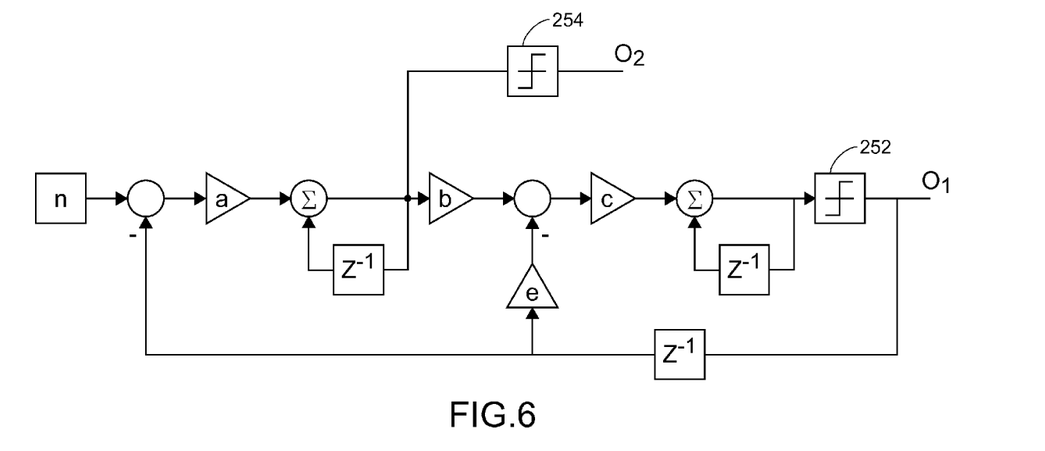
FIG. 6 depicts the discrete time function of a second-order ΔΣ modulator.

Hence, the $1^{st}$ comparator 252 and the $2^{nd}$ comparator 254 can output overflow signals of same phase and frequency while the duty cycle of the overflow signal from the $2^{nd}$ comparator could reach about 50%. When the frequency division ratio N is relatively large, the second-order ΔΣ modulator is capable of producing the overflow signal close to 50% duty cycle.

Advantageously, the second-order ΔΣ modulator maintains the desired frequency division ratio and adds more randomization to the output signal, as compared to its first-order counterpart. Taking d=4 and n=5 for the second-order ΔΣ modulator as an example, the overflow output terminal still toggles 5 times in every 16 clocks while the toggling phase is randomized with a more pronounced noise shape.

Figure 7A:
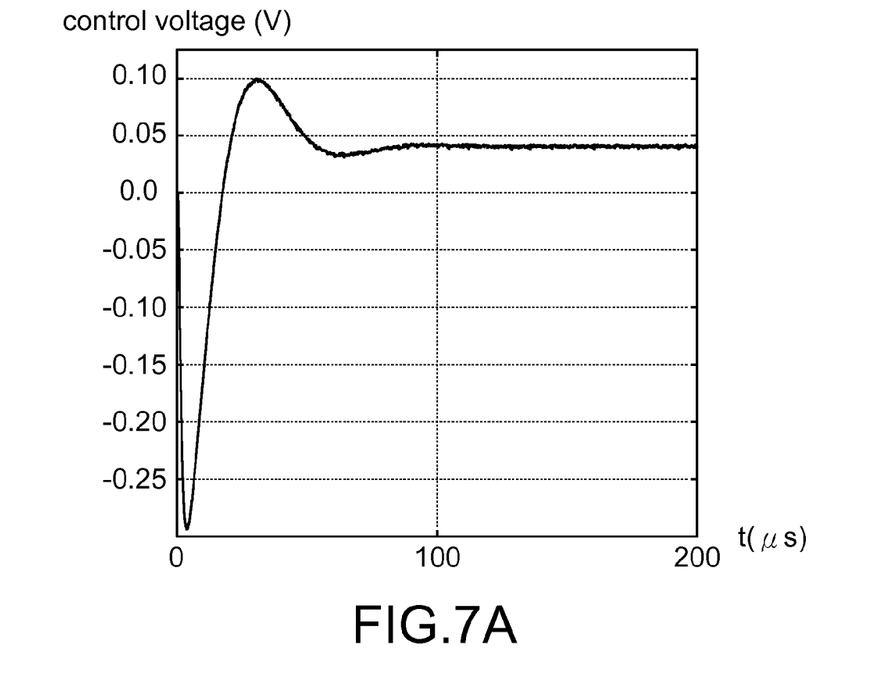
FIG. 7A depicts a simulated frequency locking transient characteristic of VCO control voltage generated by a second-order ΔΣ modulated fractional-N PLL frequency synthesizer.
Figure 7B:
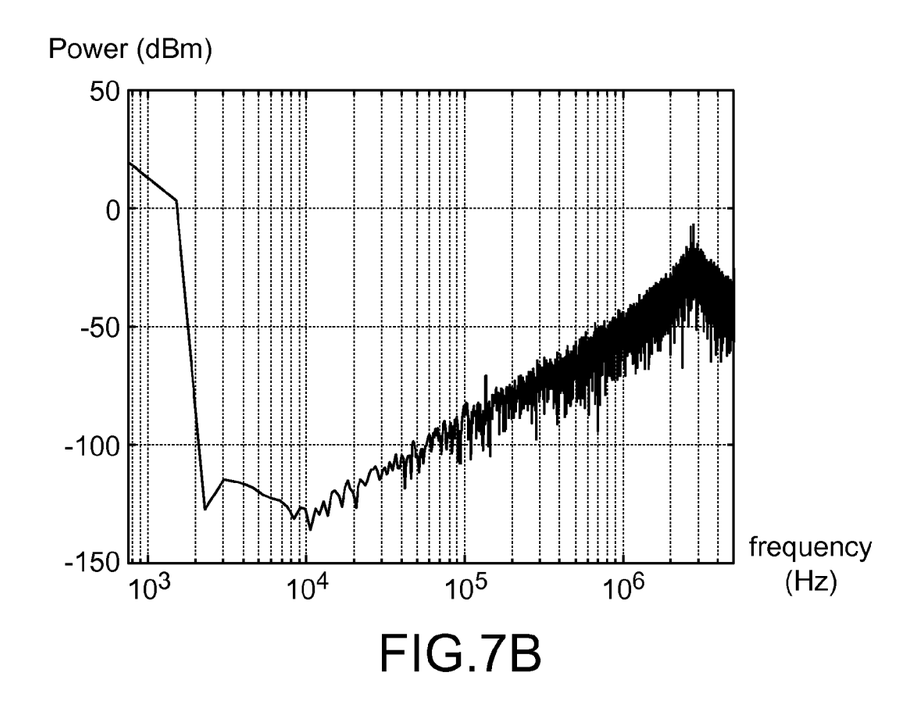
FIG. 7B depicts the Fast Fourier Transformation (FFT) spectrum of the second-order ΔΣ modulator output shown in FIG. 6.

Please refer to FIG. 7A, which illustrates the relationship between time and the control voltage generated by the second-order ΔΣ modulated fractional-N PLL frequency synthesizer. FIG. 7B illustrates the Fast Fourier Transformation (FFT) spectrum of the output signal of the second-order ΔΣ modulator in FIG. 6. As shown in FIG. 7A, the control voltage no longer displays observable ripples near steady state. Furthermore, as shown in the FIG. 7B, spurs generated by the second-order ΔΣ modulator are much reduced.

To sum up, the present invention discloses a fractional-N PLL frequency synthesizer that simplifies the circuit complexity and reduces spurs significantly. Furthermore, the present invention determines the fractional frequency division ratio N of the fractional-N PLL frequency synthesizer according to the accumulator size d of the ΔΣ modulator, e.g. a numeric counter, and the first value n. The present invention does not require any multi-modulus divider, thus significantly simplifying the fractional frequency synthesizer design. The present invention further simplifies the structure of a ΔΣ modulator and a multi-modulus divider in the prior art by a ΔΣ numeric counter and improves the output spectrum.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A fractional-N PLL frequency synthesizer, comprising:
   a phase frequency detector for receiving a reference signal with a reference frequency and an overflow signal to output a phase difference signal by detecting a phase and frequency difference between the reference signal and the overflow signal;
   a charge pump for generating a charge pump output current pulse in response to the phase difference signal;
   a loop filter for filtering the charge pump output current pulse to correspondingly generate a control voltage;
   a VCO (voltage controlled oscillator) for generating a VCO output signal with a voltage controlled frequency in response to the control voltage; and
   a delta-sigma modulator, with a clock input terminal for receiving the VCO output signal, an overflow output terminal for generating the overflow signal and an input terminal for receiving an integer, for determining a ratio between the voltage controlled frequency and the reference frequency.

2. The fractional-N PLL frequency synthesizer according to claim 1 wherein the delta-sigma modulator has an accumulator size of d bits, an input integer n, and the fractional division ratio is $2^d$/n.

3. The fractional-N PLL frequency synthesizer according to claim 1 wherein the delta-sigma modulator is a first-order delta-sigma modulator.

4. The fractional-N PLL frequency synthesizer according to claim 3 wherein the first-order delta-sigma modulator is implemented by an accumulator.

5. The fractional-N PLL frequency synthesizer according to claim 1 wherein the delta-sigma modulator is a second-order delta-sigma modulator.

6. The fractional-N PLL frequency synthesizer according to claim 5 wherein a duty cycle of the overflow signal of the second-order delta-sigma modulator is adjustable.

7. The fractional-N PLL frequency synthesizer according to claim 5 wherein the second-order delta-sigma modulator comprises a plurality of gain coefficients for adjusting the shaping of quantization noise.

8. The fractional-N PLL frequency synthesizer according to claim 7 wherein the values of the gain coefficients are $2^n$ and n is an integer.

9. The fractional-N PLL frequency synthesizer according to claim 1 wherein the width of the charge pump current pulse is proportional to a duty cycle of the phase difference signal.

10. A fractional-N PLL frequency synthesizer, comprising:
a phase frequency detector for receiving a reference signal with a reference frequency and an overflow signal to output a phase difference signal by detecting a phase and frequency difference between the reference signal and the overflow signal;
a charge pump for generating an output current pulse in response to the phase difference signal;
a loop filter for filtering the output current pulse to correspondingly generate a control voltage;
a VCO for generating a VCO output signal with a voltage controlled frequency in response to the control voltage;
a pre-scaler for receiving the VCO output signal to output a frequency divided signal by dividing the voltage controlled frequency with a first integer; and
a delta-sigma modulator, with a clock input terminal for receiving the frequency divided signal, an overflow output terminal for generating the overflow signal and a second integer input terminal for receiving a second integer,
wherein the fractional-N PLL frequency synthesizer determines a ratio between the voltage controlled frequency and the reference frequency according to the first integer and the second integer.

11. The fractional-N PLL frequency synthesizer according to claim 10 wherein the delta-sigma modulator has an accumulator size of d bits, the first integer is m, the second integer is n, and the ratio is $m*2^d/n$.

12. The fractional-N PLL frequency synthesizer according to claim 10 wherein the delta-sigma modulator is a first-order delta-sigma modulator.

13. The fractional-N PLL frequency synthesizer according to claim 12 wherein the first-order delta-sigma modulator is implemented by an accumulator.

14. The fractional-N PLL frequency synthesizer according to claim 10 wherein the delta-sigma modulator is a second-order delta-sigma modulator.

15. The fractional-N PLL frequency synthesizer according to claim 14 wherein a duty cycle of the overflow signal of the second-order delta-sigma modulator is adjustable.

16. The fractional-N PLL frequency synthesizer according to claim 14 wherein the second-order delta-sigma modulator is a single-loop second-order delta-sigma modulator.

17. The fractional-N PLL frequency synthesizer according to claim 14 wherein the second-order delta-sigma modulator comprises a plurality of gain coefficients for adjusting a shaping of quantization noise.

18. The fractional-N PLL frequency synthesizer according to claim 17 wherein the values of the gain coefficients are $2^n$ and n is an integer.

19. The fractional-N PLL frequency synthesizer according to claim 10 wherein the width of the charge pump current pulse is proportional to a duty cycle of the phase difference signal.

* * * * *